United States Patent [19]

François et al.

[11] 4,164,002
[45] Aug. 7, 1979

[54] CONNECTION ASSEMBLY FOR INTERCONNECTING A CIRCUIT BOARD AND A FRAME

[75] Inventors: Jacques François, Vincennes; Georges Guillaumot, Antony, both of France

[73] Assignee: Compagnie Industrielle des Telecommunications Cit-Alcatel, Paris, France

[21] Appl. No.: 862,805

[22] Filed: Dec. 21, 1977

[30] Foreign Application Priority Data

Dec. 28, 1976 [FR] France .......................... 76 39283

[51] Int. Cl.² ............................................. H05K 1/04
[52] U.S. Cl. ..................................... 361/399; 361/408
[58] Field of Search ............... 361/399, 408, 415, 417, 361/419

[56] References Cited

U.S. PATENT DOCUMENTS

| | | | |
|---|---|---|---|
| 3,052,821 | 9/1962 | Scoville | 361/399 |
| 3,258,649 | 6/1966 | Arguin et al. | 361/415 |
| 3,519,890 | 7/1970 | Ashby | 361/408 |
| 3,934,074 | 1/1976 | Evelove et al. | 361/399 |

FOREIGN PATENT DOCUMENTS 887101 1/1962 United Kingdom .

*Primary Examiner*—David Smith, Jr.
*Attorney, Agent, or Firm*—Sughrue, Rothwell, Mion, Zinn and Macpeak

[57] ABSTRACT

A circuit board is received in a cut-out in a surrounding frame. The circuit board has a peripheral ground conductor which is connected to the surrounding frame by the conductive teeth of an assembly of combs. The non-toothed spines of the combs are arranged along the margins of the surrounding frame and the teeth are inclined. They are preferably inclined in the plane of their spines. Such an assembly could be used for the amplifier of a telephone repeater assembly.

9 Claims, 7 Drawing Figures

CONNECTION ASSEMBLY FOR INTERCONNECTING A CIRCUIT BOARD AND A FRAME

FIELD OF THE INVENTION

The present invention relates to the assembly of a support board for an electric circuit on a surrounding frame, with a view to the subsequent mounting thereof in a housing for containing this electric circuit board either alone or with other electric circuit boards also assembled on frames.

BACKGROUND OF THE INVENTION

The fixing of such a board in an outer housing sets numerous problems, in particular when the electric circuit carried by the board operates in very high frequency ranges, for example from a few MHz to several GHz. This is the case in particular with some repeaters used on long-distance telephone connections which convey signals whose maximum frequency can reach a few tens of MHz and in which the electric operation of the amplifiers installed on one or several boards must be verified up to frequencies of the order of GHz.

One of the difficulties which arise in amplifiers of this type is the provision of equipotential connections; in particular the electric circuits of the amplifiers installed on the boards include a number of points which must be brought to a common reference potential identical to the potential of the metallic frame on which the boards are installed. In the following part of the specification, the assembly of these equipotential connections will be called "electrical earth".

A simple solution for forming these equipotential junctions as exactly as possible consists in metal-coating the periphery of the board and in soldering this metal coated part to the frame, but it is necessary to take into account the various temperature variations to which the board and frame assembly will be subjected during operation, essentially due to the thermal dissipation of the electrical components and to variations in ambient temperature. These variations in temperature result in different dimensional variations for the board which will, for example, be made of ceramics and for the frame which will be metal. It is therefore necessary for the mechanical connection between the board and the frame to compensate for these dimensional variations as well as for the production tolerances of the parts constituting the assembly.

Preferred embodiments of the present invention provide a connection between a support board of an electric circuit and a surrounding frame meeting these requirements.

SUMMARY OF THE INVENTION

The present invention provides a connection assembly for connecting an electric circuit support board to a surrounding frame which is formed by a plate provided with an inner cut-out accommodating said board without its coming into contact with the inside edges of said frame, the connection assembly including a plurality of electrically conductive combs with their teeth disposed between each inside edge of the frame and the facing edge of the board, the teeth of each comb being inclined to the edges of the frame and the board, the spine of each comb being disposed along an inside margin of the frame and being fixed thereto, while the ends of the teeth are soldered to the periphery of the board.

Embodiments of the invention are described by way of example with reference to the accompanying drawings in which.

DESCRIPTION OF THE PREFERRED EMBODIMENTS

Figure 1:
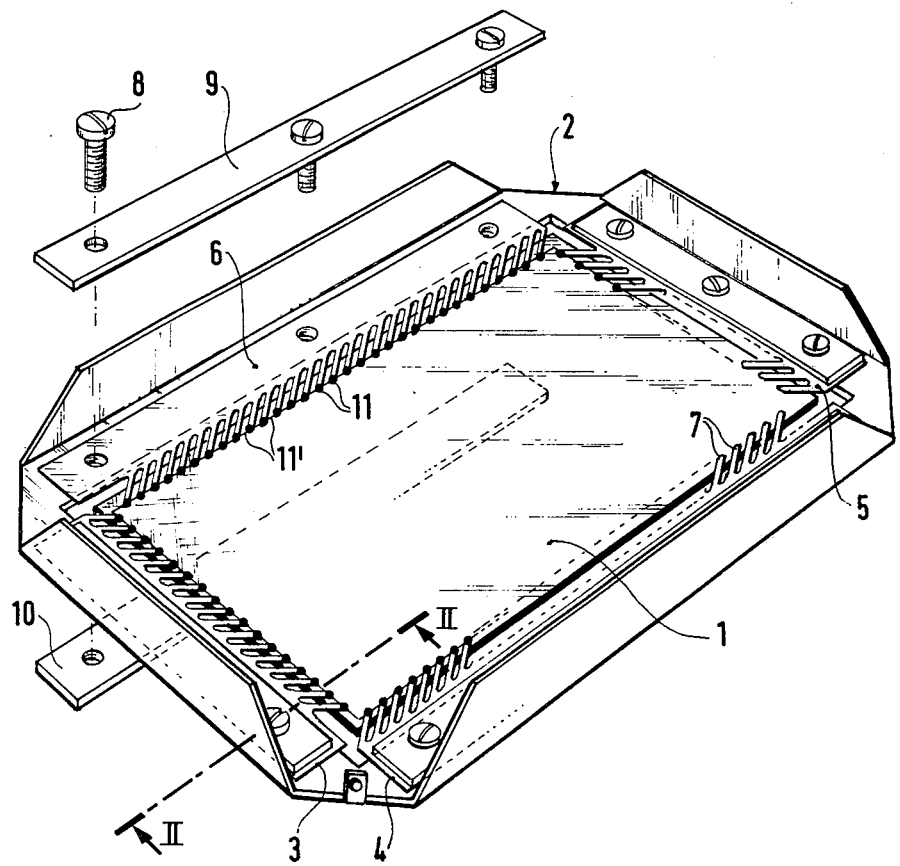
FIG. 1 is a perspective, exploded view which shows a support board for an electric circuit fixed on a surrounding frame by means in accordance with this invention.
Figure 2:
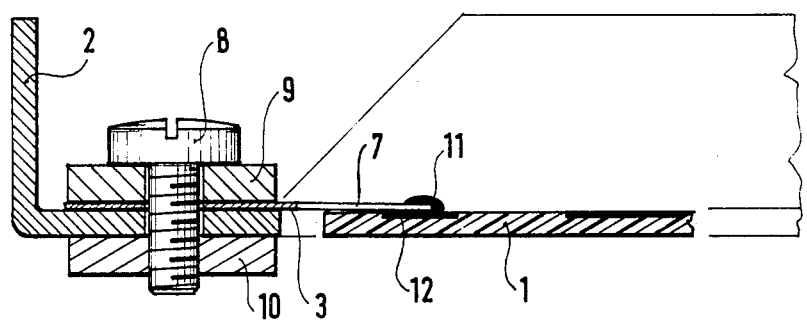
FIG. 2 is a cross-section view of a portion of the assembly according to FIG. 1, along a line II—II.

In FIGS. 1 and 2, a support board for an electric circuit has been designated by the reference 1. It is fixed on a surrounding frame designated by the reference 2. With a view to simplifying the presentation of the assembly, the board 1 is shown without the electric circuit which it normally carries.

The board 1 is in the form of a plate, for example a printed circuit plate. It is made for example of ceramics or alumina.

The frame 2 is constituted by a metal plate with an interior cut out or opening, the board 1 is accommodated in the cut out, at a short distance from the inside edges of the frame, without, however, touching with the inside edges of the frame. The outside edge of the frame is folded, so as to form an outer flange which stiffens the assembly and also provides a protection for the electric circuit which is normally carried by the board.

The board 1 is fixed on the frame 2 by means of four combs, 3 to 6. These combs are made of a single metal which is a good electrical conductor; advantageously, they are made of copper and they are tinned.

Figure 3:
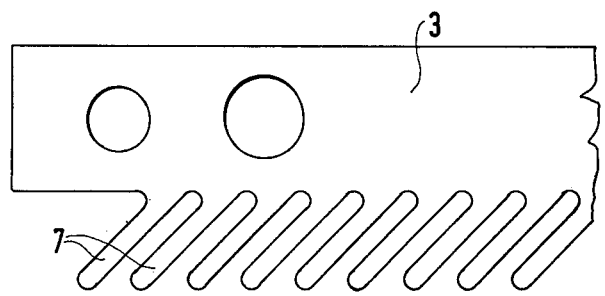
FIG. 3 is a plan view of a portion of a unit for fixing the board on its frame.

Each of these combs, for example the comb 3 shown in FIG. 3, is made of a flat rectangular part cut out along its edges to form teeth such as 7 which are inclined in the plane of the part. The inclination of the teeth and their length are defined carefully; here the inclination of the teeth is 45°; the distance which each tooth projects, parallel to the small side of the comb is slightly greater than the spacing between the edge of the board and the inside edge of the frame. Each of the cut out tooth-forming parts is tinned: this treatment, of depositing a layer of tin-lead alloy, for example, is carried out on the whole surface of the comb, including on the edges of the teeth.

The un-cut longitudinal spine of each comb partially covers the corresponding inside margin of the frame, slightly overlapping the free space between the frame and the card. It is fixed by screws such as 8 on the inside margin of the frame in conjunction with a plate 9 and a reinforcing plate 10. The four combs are thus fixed on the four inside margins of the frame the ends of the teeth of the combs extending onto the periphery of the board. In FIG. 1, the direction of the inclination of the respective combs is the same. This configuration is schematically shown in FIG. 4a in which arrows 13, 14, 15 and 16 show the direction of the inclination of the teeth of each comb: all the teeth would be parallel to each other if the perimeter of the board in this embodiment were to be developed along a straight line.

The ends of all the teeth of each of the combs are fixed on the board 1 by soldering in a continuous pass.

This soldering is performed along a conductive strip 12 (FIG. 2) printed on the periphery of the board and brought to the earth potential of the electric circuit. When the connection has been made, blobs of solder are formed on the points of the teeth of each comb shown schematically as points 11, these non-contiguous points all being interconnected by a solder bead 11'. The frame is thus connected in a practically continuous manner to the peripheral earth of the electric circuit; which makes it possible to connect, in these same conditions, the peripheral earth of the circuit to the housing which will accommodate the frame.

Figure 4A:
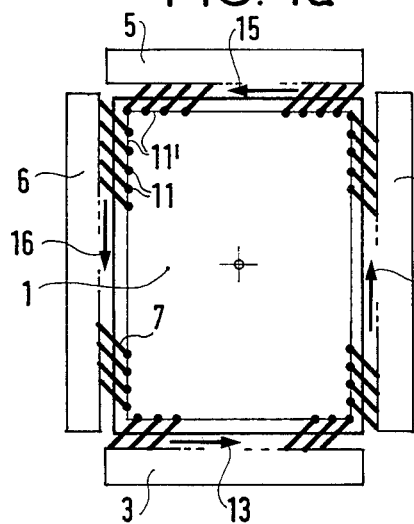
FIG. 4a, 4b and 4c are plan views illustrating methods of fixing the board in accordance with the preceding embodiment and in accordance with two other variants respectively.
Figure 4B:
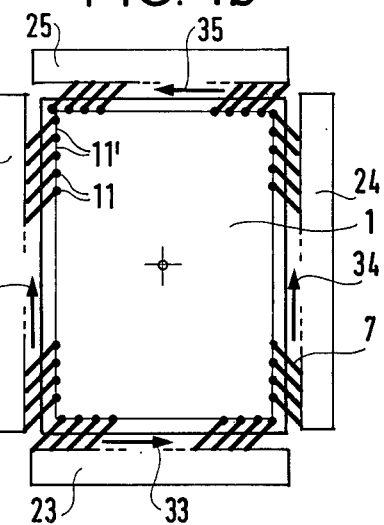
Figure 4C:
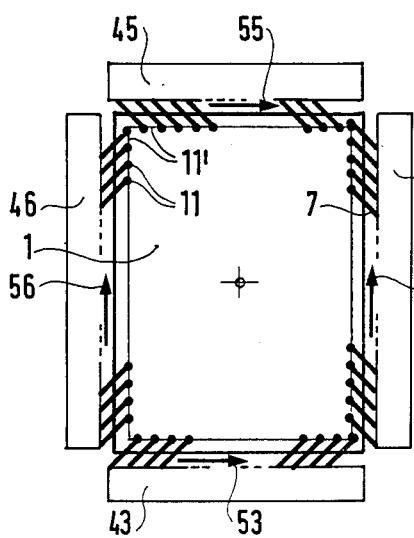

FIGS. 4b and 4c show schematically variant configurations of the assembly of the combs on the periphery of the board 1; these variants are considered in comparison with FIG. 4a.

In FIG. 4b, the combs are designated by 23 to 26 respectively; the direction of the inclination of the teeth of each comb is given by respective arrows 33 to 36. The inclination of the teeth of one of the combs, in this case the comb 26, is inverted on the developed perimeter of the board.

In FIG. 4c, the combs are designated by the references 43 to 46 respectively, the direction of the inclination of the teeth of the combs is given by the corresponding arrows 53 to 56. On the developed perimeter of the board, the direction of inclination of the teeth is inverted on two contiguous sides in relation to the assembly according to FIG. 4a.

In these three cases of assembly, a change in dimensions of the frame will cause the board to move; the board remains free from stresses.

Figure 5:
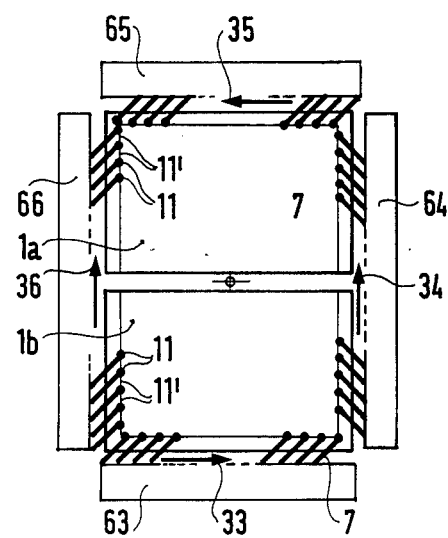
FIG. 5 is a plan view which shows a method of fixing two half boards for supporting electric circuits, fixed on a surrounding frame, in accordance with this invention.

FIG. 5 is a variant given with reference to FIG. 4b; it corresponds to the case where the support-board of the electric circuit which was previously in the form of a single support for the electric circuit is substituted by two half boards designated respectively by 1a and 1b for supporting the electric circuit. The two parts of the electric circuit on these two half boards are not illustrated; they will be connected together. The frame not shown remains unchanged and the two half boards are accommodated in its interior cut-out.

The two half boards 1a and 1b are fixed by four combs 63 to 66 with inclined teeth, in accordance with the inclinations given in FIG. 4b; the direction of the inclination of the teeth of each comb is indicated by arrows identical to those of FIG. 4b and is hence illustrated by the same references 33 to 36 as those used in this FIG. 4b. Each of the two half board 1a and 1b is fixed by three sides on the frame.

Of course, as a variant, the assembly shown schematically in FIG. 4a or 4c can be used for connecting half support boards for an electric circuit.

Although the present invention has been described with reference to the embodiments illustrated in the accompanying drawings, without going beyond the scope of the invention, details can be modified and/or some means can be replaced by equivalent means.

What is claimed is:

1. A connection assembly for connecting an electric circuit support board to a surrounding frame, said frame being formed by a plate provided with an inner cut-out for accommodating said board without said board contacting the inside edges of said frame, said connection assembly comprising a plurality of electrically conductive combs, said combs each having teeth disposed between an inside edge of the frame and the facing edge of the board, said frame and board edges and said teeth being coplanar, the teeth of each comb being inclined to the edges of the frame and the board in contact therewith, the spine of each comb being disposed along an inside margin of the frame, means for fixing the spine of each comb along an inside margin of said frame, and the ends of the teeth being soldered to the periphery of the board.

2. A connection assembly according to claim 1, wherein said teeth are inclined in the plane of said comb.

3. A connection assembly according to claim 1, wherein said teeth of all of said combs are parallel to each other along the perimeter of said board when the perimeter is developed along a straight line.

4. A connection assembly according to claim 1, wherein the direction of inclination of the teeth of one of the combs is inverted in relation to that of the teeth of the other combs, along the perimeter of said board when developed along a straight line.

5. A connection assembly according to claim 1, wherein the direction of the inclination of the teeth of two contiguous combs is inverted in relation to that of the teeth of other combs, along the perimeter of said board when developed along a straight line.

6. A connection assembly according to claim 1, wherein said combs are tinned.

7. A connection assembly according to claim 1, wherein a conductive strip is printed on the periphery of the board and constitutes the electric earth circuit of said board, and wherein said teeth are soldered to said strip.

8. A connection assembly according to claim 7, wherein non-contiguous blobs of solder are carried on the respective teeth of each comb which are electrically connected together by a solder bead.

9. A connection assembly according to claim 1, wherein the board comprises two rectangular half boards for supporting an electric circuit, said two half boards being accommodated one beside the other in said frame and without contact with said frame and each being fixed on the frame on its three sides facing the inside edges of the frame by means of said comb inclined teeth.

* * * * *